United States Patent [19]
Fujishiro

[11] 3,745,429
[45] July 10, 1973

[54] CONTROLLABLE JUNCTION DEVICE AND RADIATION-GENERATING METHOD OF UTILIZING IT

[75] Inventor: Yasuo Fujishiro, Suginami-ku, Tokyo, Japan

[73] Assignee: Iwatsu Electric Co., Ltd., Tokyo, Japan

[22] Filed: June 23, 1971

[21] Appl. No.: 156,117

Related U.S. Application Data

[63] Continuation-in-part of Ser. No. 128,137, March 25, 1971, which is a continuation of Ser. No. 786,719, Dec. 24, 1968.

[52] U.S. Cl. .... 317/235 R, 317/235 N, 317/235 AQ
[51] Int. Cl. .......... H01l 15/00
[58] Field of Search .......... 317/235 N, 235 AQ

[56] References Cited

UNITED STATES PATENTS 3,390,311 6/1968 Aven et al. .......... 317/237

*Primary Examiner*—Martin H. Edlow
*Attorney*—Woodcock, Washburn, Kurtz & Mackiewicz

[57] ABSTRACT

A controllable junction device and a radiation-generating method of utilizing said device; more particularly, a controllable junction device which usually functions as a resistor but is also able to operate as a transistor or diode. In addition, there is disclosed a radiation-generating method which uses such device to produce radiations of a higher energy than radiations to which it is exposed.

12 Claims, 14 Drawing Figures

CONTROLLABLE JUNCTION DEVICE AND RADIATION-GENERATING METHOD OF UTILIZING IT

RELATED APPLICATIONS

This is a continuation-in-part of application Ser. No. 128,137, filed Mar. 25, 1971 which is a continuation of application Ser. No. 786,719, filed Dec. 24, 1968.

BACKGROUND OF THE INVENTION

In recent years, improvements in semiconductive material have enabled development of diodes and transistors in which various substances are used as the semiconductive mother material. However, it has, in many cases, been difficult to form a p-n junction using a large band gap semiconductive mother material, especially in the case of large band gap compound semiconduction. This is because to be dominant only one kind of carrier, hole or electron, can be produced. The development of a desirable transistor or diode from semiconductors of this type has been at a standstill. Furthermore, in conventional injection-type luminescence diodes, little luminescence is observed in the visible range of radiations except for GaP, $GaP_xAs_{1-x}$, $Ga_xAl_{1-x}As$ and SiC: even with those, it has not been possible to convert input radiations into radiations having higher energy.

BRIEF SUMMARY OF THE INVENTION

An object of this invention is to provide a controllable junction device which is able to easily form p-n junctions even when employing a large band gap semiconductor as a mother material.

Another object of this invention is to provide a controllable junction device which is producable by a few simple processes.

A further object of this invention is to provide a controllable junction device which usually functions as a resistor but is also able to operate as a transistor or diode.

An additional object of this invention is to provide a junction device having easily controllable transistor or diode characteristics.

A still further object of this invention is to provide a controllable junction device which can emit radiations of a higher energy than radiations to which it is exposed.

Another object of this invention is to provide a controllable junction device which can emit visible and/or ultraviolet radiation.

Still another object of this invention is to provide a radiation-generating method using a controllable junction device to generate radiations of a higher energy.

A further object of this invention is to provide a method of generating visible and/or ultraviolet radiations by means of a junction-type luminescence diode.

A further object of this invention is to provide a junction-type luminescence and a light-generating method applicable to light sources, indication, logic circuits and memory functions.

In accordance with one aspect of this invention, a controllable junction device comprises a semiconductor body characterized by a particular energy gap, a first region of the body containing impurities of one conductivity and a second region of the body containing impurities of the one conductivity type and another conductivity type. Impurities of the other conductivity type have a deep energy level in the band gap relative to the energy level of the one conductivity type such that the body is characterized by the one conductivity type in both regions at thermal equilibrium. When the second region is irradiated with light, the conductivity of the second region will invert to the other conductivity type.

In accordance with another aspect of the invention, bias is applied between the first region and the second region whereby the device emits radiation of a higher level within the energy level of light irradiating the second region.

The above and other objects, features and advantages of this invention will become apparent from the following detailed description of illustrative embodiments shown in the accompanying drawings.

BRIEF DESCRIPTION OF THE DRAWINGS

FIG. 4 is an energy level diagram referred to in discussion of FIG. 3 without bias voltage;

FIG. 5 is an exemplary energy level diagram of the application of a bias voltage to the controllable junction device of FIG. 3;

FIG. 6 is a sectional view schematically illustrating another embodiment of a controllable junction device embodying the invention;

FIG. 7 is an energy level diagram of the controllable junction device shown ih FIG. 6;

FIG. 8 is a schematic sectional view illustrating irradiation of the controllable junction device of FIG. 6;

FIG. 9 is an energy level diagram of the controllable junction device shown in FIG. 8 without bias voltage;

FIG. 10 is an exemplary energy level diagram of the application of a bias voltage to the controllable junction device of FIG. 8;

FIG. 11 is a schematic sectional view illustrating irradiation of another embodiment of a controllable junction device embodying the invention;

FIG. 11 is an energy level diagram of the controllable junction device shown in FIG. 11;

FIG. 13 is a schematic sectional view illustrating irradiation of still another embodiment of a controllable junction device embodying the invention; and FIG. 14 is an energy level diagram of the controllable junction device shown in FIG. 13.

DESCRIPTION OF PREFERRED EMBODIMENTS

Figure 1:
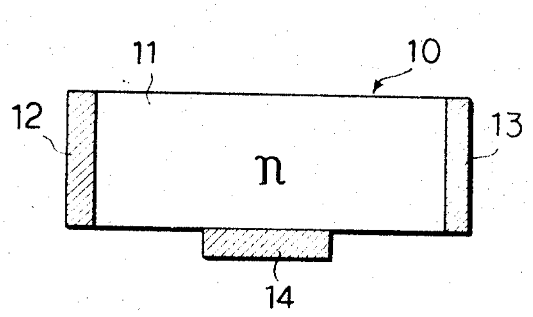
FIG. 1 is a sectional view schematically illustrating one embodiment of a controllable junction device embodying the invention.

Referring to FIG. 1, the controllable junction device 10 comprises an n-type semiconductive body 11 which exhibits dominantly electron conduction at a thermal equilibrium. A pair of electrodes 12 and 13 respectively provided at the opposite end portions of said semiconductive body 11 make an ohmic-contact with the n-type; that is to say, an ohmic-contact with the same conductivity type that said semiconductive body 11 exhibits at a thermal equilibrium. The electrode 14 provided at an intermediate portion of semiconductor body 11 is one for a bias voltage, as will be described later. Electrode 14 makes an ohmic-contact with the p-type; that is to say, an ohmic-contact with conductivity type opposite to the conductivity type which said semiconductive body 11 indicates at a thermal equilibrium.

Figure 2:
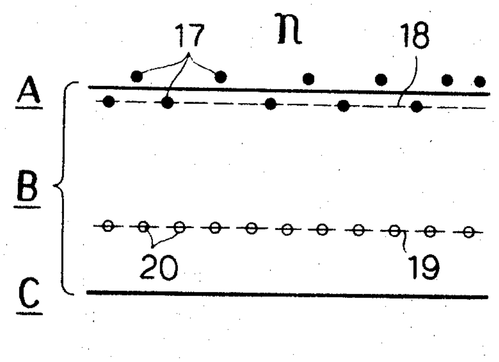
FIG. 2 is an energy level diagram of the controllable junction device shown in FIG. 1.

Semiconductive body 11 comprises semiconductive material which is of a large band gap and dominantly exhibiting electron conductivity at a thermal equilibrium. Such material may be an intermetallic compound semiconductor or other compound semiconductor, for example, CdS, CdSe, ZnS, ZnSe, ZnO, Cd(S,Se), Zn(S,Se), Zn(Se,Te), (Cd,Zn)S, and (Cd,Zn)Se. A donor impurity added to the semiconductive material results in formation of a shallow donor level 18 of about 0.02eV (FIG. 2) near the bottom of a conductive band A in the forbidden band B of said semiconductive body 11. Such donor impurity may be a tri-valent metal, for example, In, A1, etc., or may be a halogen, for example, C1, I, etc. An acceptor impurity added to the semiconductive material results in formation of a deep acceptor level of about 0.25 eV at a substantially deep location in the forbidden band B of said semiconcuctive body 11. Such acceptor impurity may be monovalent metal, for example Cu, Ag. etc., or may be a penta-valent element, for example, P, As, Sb, etc. The acceptor level undergoes no excitation at a thermal equilibrium and its hole, therefore, is maintained under capture by an acceptor atom. The concentration of donor impurity of said shallow level is approximately $10^{15}$ – $10^{18}$ atoms/cm$^3$ while the concentration of the acceptor impurity of deep level is higher than that of donor impurity of shallow level. These donor and acceptor impurities can respectively be included uniformly in the semiconductive material by means of the crystal-growth method, the diffusion method, etc., or said acceptor impurities may be included in said intermediate portion or inversion-expected layer, which desirably is of p-type and of higher density compared with other body portions. In addition, because the acceptor level 19 does not undergo excitation at a thermal equilibrium, its hole is maintained under capture by said acceptor atom; in other words, hole conduction does not occur at room temperature. In FIG. 2, reference letter C represents a valence band, and reference numbers 17 and 20 indicate electron and hole, respectively.

Electrodes 12 and 13 may be composed of In, an In-Hg alloy, an In-Ga alloy, etc., and electrode 14 may be made of Au, Pt, Ir, etc.

When radiations, as from lasers 16, having energy sufficient to cause excitation of hole 20 into the valence band C from acceptor level 19,(in other words, having energy higher then the difference between acceptor level 19 and the top of valence band C) are applied to the intermediate portion of semiconductive body 11 of the junction device, resonance absorption causes excitation of hole 20 of acceptor level 19 into valence band C and makes the density of said hole higher than the existing electron density. The intermediate portion of body 11 (FIG. 3) then becomes a p-layer of region 15, on both sides of which existed originally n-type regions or portions **11*a* or 11*b* respectively. This results in formation of an n-p-n junction comprising regions 11*a*, 15 and 11*b*. Furthermore, since electrodes 12 and 13 provide ohmic-contact of the n-type to the n-type regions 11*a* and 11*b* respectively, and electrode 14 provides ohmic-contact of the p-type to p-type region 15, device 10 becomes an n-p-n junction transistor when exposed to radiations 16** over an area of, for example, $1 \times 10^{-8}$cm$^2$ by $1 \times 10^{-2}$cm$^2$.

Because electron 17, existing in conductive band A beforehand, and hole 20, formed in valence band C through radiations 16, are recombined in formation of region 15, luminescence having energy of almost same width as the forbidden band B is produced. Radiations 16 are, therefore, converted by their application to the controllable junction device 10 into radiations having higher energies than the energies of applied radiations 16.

However, unless a bias voltage is applied between electrode 14 and electrode 12 or 13, as will later be referred to, the carriers, that is, electron 17 and hole 20 are not supplied successively. In consequence, luminescence from body 11 may only be quite instantaneous upon short exposure to the radiations. Although the radiations 16 may just have energy sufficient to cause excitation of hole 20 into valence band C from deep acceptor level 19, it is more desirable to use lasers which have a high-energy density and are characterized by excellent focusing. The intensity of irradiation required of such lasers is $10^{13}$–$10^{21}$ photons/cm$^2$/second with $10^{15}$–$10^{19}$ being preferred and $10^{17}$ ideal for many applications. This irradiation may also be expressed in watts; i.e., 0.1 milliwatt – 10 kilowatts/cm$^2$ with 10 milliwatt–100 watts/cm$^2$ preferred and 1 watt/cm$^2$ ideal for many applications. In FIG. 4, arrow marks 21 indicate the process of transistion caused by absorption of radiation.

Figure 3:
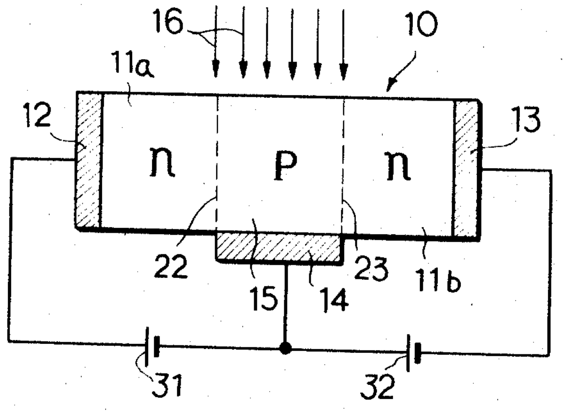
FIG. 3 is a schematic sectional view illustrating irradiation of the controllable junction device of FIG. 1.

Device 10 illustrated in FIGS. 3 and 4 operates as a transistor by applying necessary bias voltages between electrodes 12 and 14, and/or between electrodes 13 and 14. When a sufficiently high bias voltage in a reverse direction is applied of the order of 150 volts, the p-n junction 22 is biased very deeply in a reverse direction by means of a voltage source 31 between electrodes 12 and 14. For voltage higher than a certain applied voltage, as illustrated in FIG. 5, avalanche multiplication — the process of which is indicated by arrow marks 24 and 25 — brings about the creation of an electron-hole pair in junction region 22, or also an electron-hole pair will be created by tunnel injection shown by arrow mark 27. Such processes, provides emission of radiations of high energy through recombining process illustrated by arrow mark 26. This application of avalanching bias voltage, therefore, causes conversion of incoming radiations 16 into outgoing radiations of higher energy.

On the other hand, if a sufficiently high bias voltage in a forward direction of approximately 2 volts is applied between electrodes 13 and 14 by means of source 32 simultaneously with the above case, the p-n junction 23(FIG. 3) is biased deeply in a forward direction. As in the known diode-injection-type luminescence, the injected minority and majority carriers emit radiations. Luminescence based on the recombination process, shown by arrow marks 28, is observed, thus resulting in conversion into radiations of a high energy.

In this case, when with sufficiently large injection, a negative temperature, that is, inversion distribution may arise in the junction end or junction surface, so stimulated emission is made possible. Consequently, it also becomes possible to produce laser oscillation by device 10 when gain in stimulated emission is larger than absorption and other resonator losses. In addition, either reverse bias or forward bias may be applied between electrodes 12 and 13 and between electrodes 12 and 14 respectively.

The controllable transistor (FIGS. 3,4) can be given various characteristics such as a luminescence characteristic as required, by changing the intensity of irradiation, the area of irradiation, the breadth of irradiation in the range of 1–20$\mu$ etc. Furthermore, by varying the intensity of irradiation with space or distance, a junction can be made either into an abrupt one or into a graded one. For instance, if irradiation is strong and uniform, or if strong irradiation occurs at both end portions within the irradiation space, an abrupt junction is obtained; and if weak irradiation occurs in both end portions within the irradiation space, a graded junction is secured.

In case of using radiations with excellent focusing-like lasers, etc., it is possible to irradiate a very small space, thereby making the breadth of the base of device 10 very narrow. The breadth of the base can be freely controlled in a manner dependent upon the breadth of the base irradiation. When the irradiation of device 10 is discontinued, it reverts from a transistor back to a resistor.

Referring to FIGS. 6–10, the controllable junction device 10 comprises a p-type semiconductive body 11 and a pair of electrodes 12 and 13 which are respectively provided to the opposite end portions of said semiconductive body 11. These electrodes make an ohmic-contact with the p-type; that is to say, ohmic-contact of the conductivity type that said semiconductive body 11 exhibits at a thermal equilibrium. Electrode 14 contacts the irradiated or intermediate portion of said semiconductive body 11. This electrode provides an ohmic-contact with the conductivity type whose polarity is opposite to that exhibited by semiconductive body 11 at a thermal equilibrium. In this embodiment, quite contrary to that illustrated in FIGS. 1–5, the semiconductive material of semiconductive body 11 is of the type such as an intermediate compound semiconductor or other compound semiconductor, for example, CdTe, ZnTe, (Cd,Zn)Te, etc. and forms a p-n-p type transistor with irradiation of 16. However, its principle is quite identical with the embodiment shown in FIGS. 1–5, and can be explained almost in the same manner as the embodiment of FIGS. 1–5 by replacing electron with hole, n-type with p-type, and donor with acceptor, vice versa. Consequently, a detailed description on this embodiment is omitted, but identical reference numbers are applied to those portions that are common between the two embodiments. Additionally, reference numbers 29 and 30 in FIGS. 7, 9 and 10 are indicative of a deep donor level and a shallow acceptor level respectively.

Furthermore, in the embodiment of FIGS. 1–5 and also in the embodiment of FIGS. 6–10, when the circuit to electrode 12 or 13 is opened and a proper bias voltage is applied between electrode 14 and electrode 13 by means of source 32, or between electrodes 14 and 12 by means of source 31, the device 10 can be used as a diode of the luminescence type or a normal one.

Next, referring to FIGS. 11 and 12 illustrating a further embodiment of this invention, the controllable junction device 10 comprises an n-type semiconductive body 11 and an electrode 12 provided at one end portion of said semiconductive body. This electrode makes an ohmic-contact with n-type; that is to say, an ohmic-contact with the same conductivity type exhibited by said semiconductive body 11 at a thermal equilibrium. The electrode 14 contacting the other end portion of semiconductive body 11 makes an ohmic-contact with the p-type; that is to say, an ohmic-contact whose conductivity type is of opposite polarity to that exhibited by semiconductive body 11 at a thermal equilibrium.

The embodiment shown in FIGS. 11 and 12 omits the n-type region **11*b* and the electrode 13 or previously described embodiments and the location of electrode 14 is altered. In this case, it is possible, as described in the embodiment shown in FIGS. 1–5, to apply a forward or reverse bias voltage (reverse in FIG. 11) between electrodes 12 and 14 by means of source 31, which voltage causes luminescence due to injection, avalanche multiplication, tunnel injection, etc., that is to say, the device illustrated in FIGS. 11, 12** can be actuated as a luminescence-diode or a normal one.

Referring to FIGS. 13 and 14 illustrating another embodiment of the invention, the controllable junction device 10 comprises a p-type semiconductive body 11. The electrode 12 at one end portion of said semiconductive body 11 makes an ohmic-contact with the p-tupe, that is to say, an ohmic-contact with the same conductivity type exhibited by said semiconductive body 11 at a thermal equilibrium. The electrode 14 provided at the other end portion of semiconductive body 11 makes an ohmic-contact with the n-type, that is to say, an ohmic-contact whose conductivity type is of an opposite polarity to that exhibited by semiconductive body 11 at a thermal equilibrium.

This embodiment (FIGS. 13, 14) omits p-type region 11b and electrode 13, and the location of electrode 14 is altered. In this case, the application of a suitable forward or reverse bias voltage (forward in FIG. 13) between electrodes 12 and 14 by means of source 32, causes luminescence due to injection, avalanche multiplication, tunnel injection, etc. The device 10 illustrated in this embodiment (FIGS. 13, 14) can be actuated as a luminescence-diode or a normal one.

From the foregoing it should be apparent that it is also possible to produce a multi-junction device such as an n-p-n-p type, an n-p-n-p-n type, a p-n-p-n-p type, etc. by providing additional electrodes to the semiconductive body and irradiating several portions of the semiconductive body.

Although the illustrative embodiments of this invention have been described in detail above with reference to the accompanying drawings, it is to be understood that this invention is not limited to those precise embodiments, and that various changes and modifications may be effected therein by one skilled in the art without departing from the scope or spirit of the invention as defined in the appended claims.

What is claimed is:

1. A controllable junction device comprising a semiconductor body characterized by a substantial energy band gap, a first electrode in ohmic-contact with a first region of said body containing first impurities of one conductivity type, and a second electrode in ohmic-contact with a second region of said body containing second impurities of another conductivity type and said first impurities of said one conductivity type, said second impurities having a relatively deep energy level in said energy band gap as compared with the energy level of said first impurities in said energy band gap such that said body is characterized by said one conductivity type in both regions at thermal equilibrium and said other conductivity type in said second region when light impinges thereon.

2. The system of claim 1 wherein said one conductivity is of an n type and said other conductivity is of a p type.

3. The system of claim 1 wherein said one conductivity is of a p type and said other conductivity is of an n type.

4. A controllable junction device comprising a semiconductor body characterized by a substantial energy band gap, at least two electrodes in ohmic-contact with at least two regions of said body containing first impurities of one conductivity type, at least one other electrode in ohmic-contact with at least one other region of said body containing second impurities of another conductivity type and said first impurities, said second impurities having a relatively deep energy level in said energy band gap as compared with the energy level of said first impurities such that said body is characterized by said one conductivity type in second two regions and said other region at thermal equilibrium and inverted to said other conductivity type in said other region when light impinges thereon.

5. The system of claim 4 wherein said one conductivity is of the n type and said other conductivity is of the p type.

6. The system of claim 4 wherein said one conductivity is of the p type and said other conductivity is of the n type.

7. A method of operating a controllable junction device comprising a semiconductor body having a substantial energy band gap, a first region of said body containing impurities of one conductivity and a second region of said body containing impurities of said one conductivity type and another conductivity type, said impurites of said other conductivity type having a deep energy level in said band gap relative to the energy level of said one conductivity type such that said body is characterized by said one conductivity type in both regions at thermal equilibrium, the method comprising the steps of:

irradiating said second region with light thereby inverting said second region to a conductivity of said other type; and applying a bias between said first region and said second region whereby said device emits radiation of higher energy level than the energy level of said light irradiating said second region.

8. The method of claim 7 wherein the irradiation is varied by varying the intensity of irradiation.

9. The method of claim 7 wherein the irradiation is varied by varying the area of irradiation.

10. The method of claim 7 wherein a reverse bias is applied between said first region and said second region.

11. The method of claim 7 wherein a forward bias is applied between said first region and said second region.

12. A method of operating a controllable junction device comprising a semiconductor body having a particular energy band gap with at least two regions of said body containing impurities of one conductivity type and at least one other region located between said two regions containing impurities of another conductivity type, said impurities of said other conductivity type having a relatively deep energy level in said band gap as compared with the energy level of said impurities of said one conductivity type such that said semiconductor body is characterized by said one conductivity type in all said regions at thermal equilibrium, the method comprising the steps of:

Applying a reverse bias between the first of said two regions and said other region;

applying a forward bias between the second of said two regions and said other region; and irradiating said other region with light, said device emitting radiation of higher energy level than the energy level of said light irradiating said other region.

* * * * *